United States Patent [19]

Hogerheiden, Jr.

[11] 4,420,839
[45] Dec. 13, 1983

[54] HYBRID RING HAVING IMPROVED BANDWIDTH CHARACTERISTIC

[75] Inventor: John Hogerheiden, Jr., Camarillo, Calif.

[73] Assignee: Bunker Ramo-Eltra Corporation, Westlake Village, Calif.

[21] Appl. No.: 363,634

[22] Filed: Mar. 30, 1982

[51] Int. Cl.³ .......................... H04B 1/26; H01P 5/22
[52] U.S. Cl. ..................................... 455/327; 333/120
[58] Field of Search ............................. 455/325–327; 333/120

[56] References Cited
U.S. PATENT DOCUMENTS

| | | | |
|---|---|---|---|
| 2,789,271 | 4/1957 | Budenbom | 333/120 |
| 2,874,276 | 2/1959 | Dukes et al. | 333/120 |
| 4,031,472 | 6/1977 | Shinkawa et al. | 333/120 |
| 4,093,928 | 6/1978 | Proctor | 333/120 |

FOREIGN PATENT DOCUMENTS

| | | | |
|---|---|---|---|
| 54-37555 | 3/1979 | Japan | 333/120 |
| 568164 | 8/1977 | U.S.S.R. | 455/326 |

*Primary Examiner*—Jin F. Ng
*Attorney, Agent, or Firm*—Freilich, Hornbaker, Wasserman, Rosen & Fernandez

[57] ABSTRACT

A hybrid ring useful in the microwave and millimeter wave regions as a mixer for producing an IF output signal in response to applied LO and RF input signals. The ring is designed to exhibit a narrow bandwidth at the LO signal port and a moderately broad bandwidth at the RF signal port.

8 Claims, 4 Drawing Figures

HYBRID RING HAVING IMPROVED BANDWIDTH CHARACTERISTIC

FIELD OF THE INVENTION

This invention relates generally to hybrid junctions useful in the microwave and millimeter wave regions and more particularly to improvements in hybrid ring (also known as "rat-race") devices useful as balanced mixers.

BACKGROUND OF THE INVENTION

Hybrid junctions, which have been widely discussed in the applicable literature, are extensively used in various radar balanced-circuit configurations, including balanced mixers, single-sideband modulators, phase and amplitude monopulse comparators, frequency multiplexers and constant impedance filters, (see e.g. *Radar Handbook*, Skolnik, Chapter 8).

Several useful forms of hybrid junctions are well known including the hybrid ring or "rat-race". Each form can generally be implemented in waveguide, coaxial line or stripline media.

The basic hybrid ring comprises a closed loop transmission line essentially six quarter wavelengths in length. Four ports on the ring are spaced 60 degrees apart geometrically and one quarter wavelength apart operationally. For an ideal hybrid ring, a signal input to port 1 divides equally between ports 2 and 4 with a 180 degree phase difference, whereas a signal input to port 3 divides equally between the same ports 2 and 4 with a zero phase difference.

The prior art is replete with variations of the basic hybrid ring. One such prior art disclosure describing a hybrid ring used as a mixer, is contained in U.S. Pat. No. 4,031,472. That patent reviews earlier devices and discloses an improved hybrid ring structure which allegedly avoids certain defects of the earlier devices; i.e. (1) the inability to derive an intermediate frequency (IF) signal in the physical plane of the hybrid and (2) the loss of output power as the IF frequency increases.

SUMMARY OF THE INVENTION

The present invention is directed to a hybrid ring useful as a mixer and particularly configured so as to exhibit a broad bandwidth at the Radio Frequency (RF) signal input port, thus avoiding bandwidth limitations of prior art devices.

In accordance with a significant feature of the present invention, the hybrid ring is designed to exhibit a considerably narrower bandwidth at the Local Oscillator (LO) signal input port than at the RF signal input port thus allowing selection of an LO frequency further away from the RF frequency than is typically possible.

In a preferred embodiment, the hybrid ring is formed by a transmission line six quarter wavelengths in length in which two adjacent quarter wavelength segments comprise coupled line sections; i.e. spaced parallel transmission line elements. The junction between the two coupled line sections defines a broadband RF signal input port.

In accordance with a further aspect of the preferred embodiment, an end coupled filter is incorporated between the ring and the LO signal input port to define a narrow bandwidth and assure good noise rejection.

DESCRIPTION OF A PREFERRED EMBODIMENT

Figure 1:
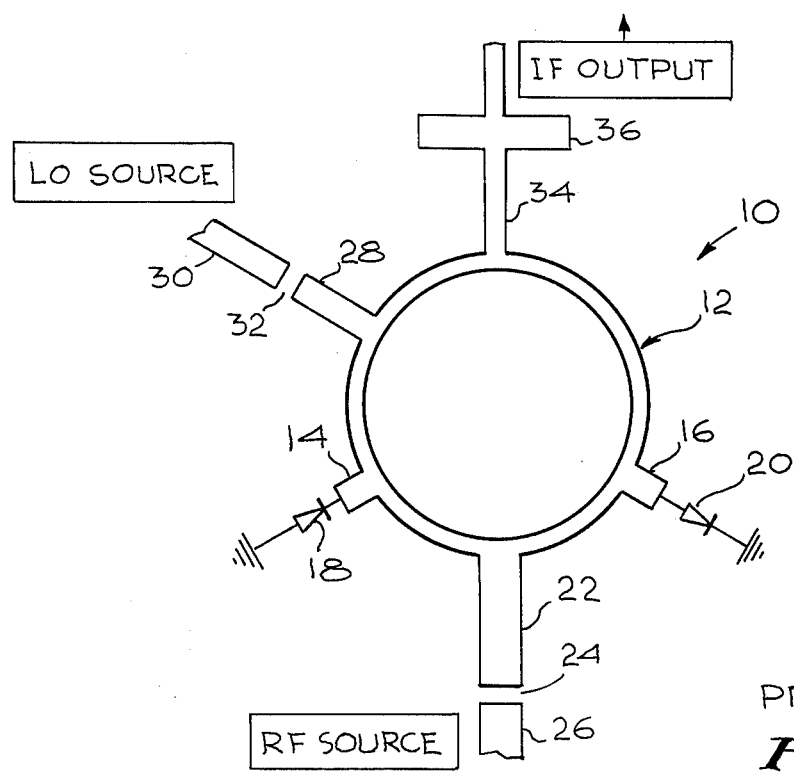
FIG. 1 is a circuit diagram depicting the structure of a prior art hybrid ring.

Attention is initially directed to FIG. 1 which depicts a prior art hybrid ring device 10 previously disclosed in FIG. 5 of the aforementioned U.S. Pat. No. 4,031,472. The device 10 comprises a transmission line formed into a closed ring 12 having a length equal to six times a predetermined quarter wavelength. Lines 14, 16, which are connected to the ring at points spaced along the ring by one half wavelength, are respectively connected to terminals of oppositely poled diodes 18, 20. The other terminals of the diodes are connected to ground. Line 22 is connected to the ring midway between lines 14 and 16 and is coupled, via capacitive decoupling gap 24, to line 26. Line 26 is intended to be coupled to an RF input signal source. Line 28 is connected to the ring one half wavelength from line 22 and one quarter wavelength from line 14. Line 30, coupled to line 28 by capacitive decoupling gap 32, is intended to be coupled to an LO input signal source. Line 34 is connected to the ring opposite to line 22 and supplies, via low pass filter 36, an IF output signal. The capacitive gaps 24 and 32 respectively decouple the RF and LO signals from lines carrying the IF signal. In order to minimize reflection, the impedance of each of lines 14, 16, 22, 28 should equal $\sqrt{2}$ times the impedance of line 12.

In the operation of device 10, as described in U.S. Pat. No. 4,031,472, the IF signals appearing from diodes 18 and 20 will be combined, in phase, at the point of connection of line 34 to ring 10. The composite IF output signal thus obtained will be delivered through low pass filter 36. Inasmuch as the line 34 is connected to the ring 10 at a position where the RF power is also at a maximum, it is important that the filter 36 exhibit a near ideal open circuit impedance against the RF signal.

Figure 2:
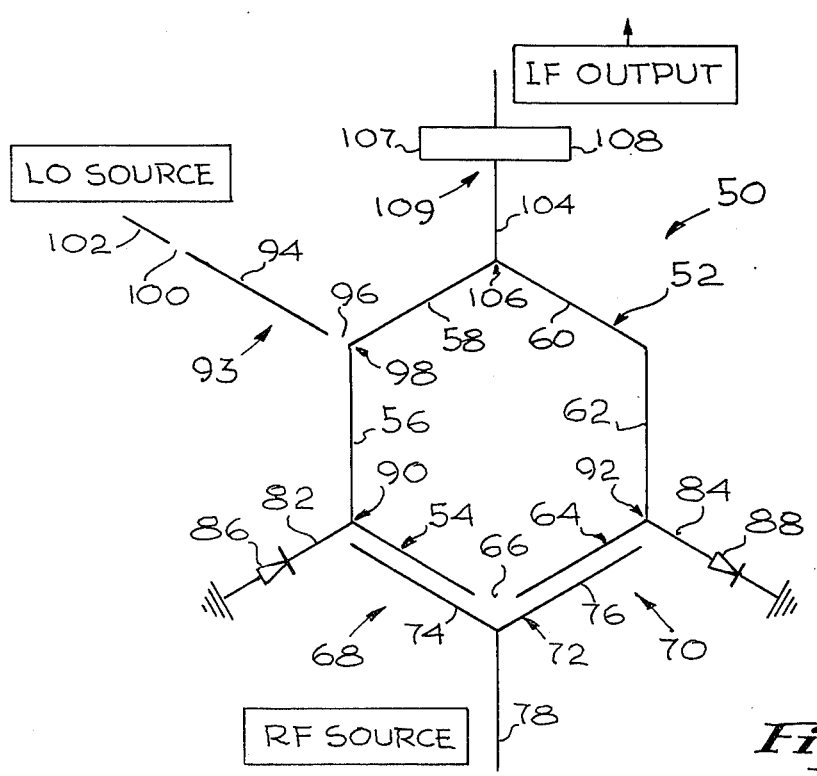
FIG. 2 is a schematic diagram of a hybrid ring in accordance with the present invention.
Figure 3:
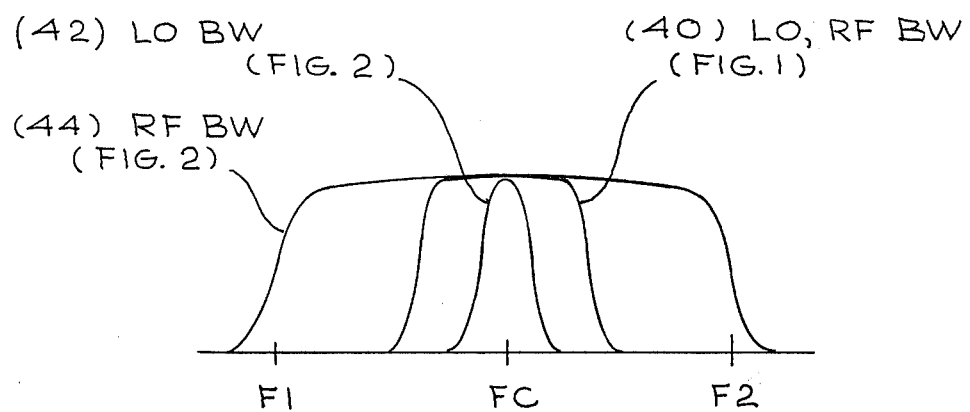
FIG. 3 is a diagram showing the relationship of passbands associated with the rings of FIGS. 1 and 2.

As with most known hybrid rings, the bandwidth seen by the LO source is essentially the same as the bandwidth seen by the RF source in the device 10 of FIG. 1. The present invention is directed to an improved hybrid ring, schematically depicted in FIG. 2, which avoids the bandwidth limitations of typical hybrid rings. FIG. 3 depicts, in curve 40, the typical LO and RF bandwidth characteristic of typical hybrid rings as exemplified by FIG. 1. Curves 42 and 44 respectively depict the LO and RF bandwidth characteristics exemplary of embodiments of the present invention, as depicted in FIG. 2. One significant advantage of the bandwidth characteristic represented by curves 42 and 44 is that a fixed LO frequency can be selected which is further away in frequency from the RF frequency than is typically achievable, thereby producing a higher frequency IF signal and assuring better isolation between the LO and RF input ports.

Attention is now directed to FIG. 2 which schematically illustrates an embodiment of a hybrid ring 50 in accordance with the present invention particularly suited for use as a mixer to supply an IF output signal in response to applied RF and LO input signals. The ring 50 can be implemented in essentially any medium that supports a true or quasi transverse electromagnetic propagation mode such as coax, stripline, microstrip or suspended stripline.

The ring 50 is comprised of a transmission line 52 having a length essentially equal to six quarter wavelengths at the LO frequency. The transmission line 52 may, for convenience, be considered, as consisting of six serially connected quarter wavelength transmission line segments 54, 56, 58, 60, 62, 64. Note that these six serially connected segments do not form a closed loop, but rather include a gap 66 between segments 54 and 64. The gap 66 is considerably shorter than a quarter wavelength.

The segments 54 and 64 comprise elements of coupled line sections 68, 70 formed together with an essentially T or Y shaped transmission line 72. The transmission line 72 includes first and second arms 74, 76 and stem 78. The arms 74, 76 are respectively spaced from and coupled to segments 54 and 64 to form effective quarter wavelength coupled line sections 68 and 70. Stem 78 is intended to be coupled to an RF signal source, as will be discussed hereafter.

Transmission lines 82, 84 respectively connect terminals of matched diodes 86, 88 to the ring at points 90 and 92. The other terminals of the diodes are connected to ground.

An end coupled filter 93 formed by transmission line elements 94 is spaced by gap 96 from point 98 on the ring between segments 56 and 58. Gap 100 spaces element 94 from transmission line 102 which is intended to be coupled to an LO signal source.

Transmission line 104 and open circuit stubs 107, 108 are connected to ring point 106, between segments 58 and 60, to function as a low pass filter 109. When operational, the filter 109 will deliver an IF output signal having a frequency equal to the frequency difference between an LO signal coupled to line 102 and an RF signal coupled to stem 78.

In use of the ring 50 as a mixer, stem 78 preferably defines the RF signal input port and transmission line 102 defines the LO signal input port. The IF output signal is preferably derived from transmission line 104 or alternatively it could be diplexed off at diode ring points 90, 92 and then summed in phase external to the ring.

Stem 78 is preferably used as the RF input port because of the broad band power split at the junction of arms 74, 76 and the moderately broad band impedance match at stem 78. The broad band power split is attributable to the end coupled filter formed by element 94. Although a single element is shown in FIG. 2, it should be understood that the filter 93 can include any number of elements, provided the filter can be realized in the chosen medium. The end coupled filter provides a high impedance at point 98 outside of its passband. The passband is centered at the LO frequency (FC in FIG. 3), which is the frequency at which segments 54, 56, 58, 60, and coupled line sections 68, 70 are effective quarter wavelengths. For an input at stem 78, there is a virtual ground generated near point 98. The LO port will not affect the RF port outside the passband of filter 93 because a high impedance is developed by the end coupled filter at point 98 which is a low impedance point on the ring.

The bandwidth of the end coupled filter is designed to be narrow, preferably less than 5%. Within this narrow band, the virtual ground occurs very close to point 98, so the isolation between the LO and RF ports is very high and the LO port will not affect the power split or impedance at the RF port. This gives good response at the RF port both inside and outside the passband of the end coupled filter.

The impedance match at the RF port is improved over typical hybrid rings as a consequence of using the quarter wave coupled line sections 68, 79 instead of quarter wave transformers, and compensating them with the line segments 56, 58, 60, 62. When a signal is injected at the RF port, it creates a virtual open circuit at point 106 for all frequenicies when the LO port is isolated. Therefore, line segments 56, 58 appear as a half wavelength open stub connected to point 90. Likewise, line segments 60, 62 appear as a half wavelength open stub connected to point 92.

These stubs, along with the coupled line sections 68, 70 form a tuned circuit. The impedance of the line segments 56, 58, 60, 62 and the even, and odd mode impedance of the coupled line sections 68, 70, are chosen to transform the load impedance at points 90, 92 to twice the impedance at the RF port. Since the junction between arms 74, 76 is the sum point for the two circuit paths, they are seen in parallel which will then be matched to the RF port.

The characteristic impedances needed for the coupled line section and the halfwave stubs, are determined by the bandwidth, VSWR, and physical structure dictated by the particular design. The symmetry of this circuit simplifies the design.

The even mode impedance ($Z_{oe}$) and the odd mode impedance ($Z_{oo}$) of the coupled line section 68 should be chosen such that:

$$\frac{Z_{oe} - Z_{oo}}{2} = \sqrt{Z_2 \times VSWR \times Z_{EQ}}$$

Where $Z_2$ is the impedance from point 90 looking into diode 86 and $Z_{EQ}$ is the impedance looking from line 78 into the RF port. The VSWR is the maximum Voltage Standing Ratio desired for the Hybrid when properly terminated.

The characteristic impedances of segments 56 and 58 should be chosen such that their suseptance compensates the suseptance of the coupled line section 68 referenced at point 90 when loaded by $Z_{EQ}$. This is preferably determined using computer aided optimization techniques. If the IF output is taken at point 106 as in FIG. 2, then an additional constraint may be placed on the values of characteristic impedance chosen for lines 56 and 58; i.e. that they aid in matching the IF impedance of the diodes 86, 88.

The impedances of coupled line section 70 should essentially equal those of coupled line section 68. The impedance of segment 56 should essentially equal that of segment 62 and the impedance of segment 58 should essentially equal that of segment 60 to retain the symmetry of the ring.

The impedance looking into the LO port is determined from the characteristic impedance of line segments 56 and 62 and the impedance of the diode loads. If the impedance of these segments is $Z_T$ and the impedance of diode loads 86 and 88 is $Z_L$, and the input impedance at the LO port is $Z_{IN}$, then:

$$Z_{IN} = Z^2_T / Z_L.$$

Filter 93 is preferably designed to the same input and output impedance as $Z_{IN}$. The RF port and coupled line sections 68 and 70 do not affect the impedance at the LO port since a virtual ground is established at the junction between arms 74 and 76 when a signal is applied to the RF port. Since the phase shift through coupled line sections 68 and 70 is close to 90 degrees over a broad bandwidth, they generate open circuits at points 90 and 92. Therefore, they do not affect the impedance at these points for a signal entering the RF port.

Figure 4:
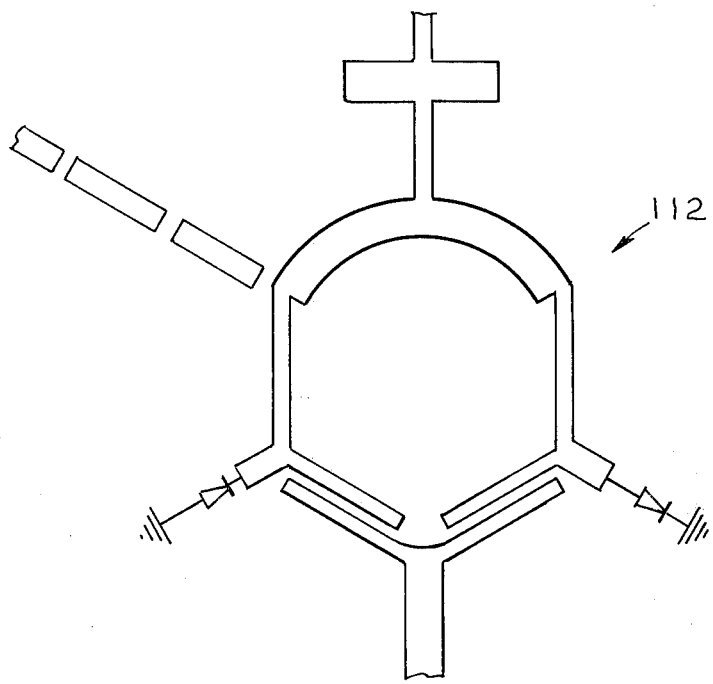
FIG. 4 is a circuit diagram depicting the structure of an embodiment of the present invention.

FIG. 4 depicts a hybrid ring 112, implemented in stripline in accordance with the invention, as schematically depicted in FIG. 2.

From the foregoing, it should now be recognized that an improved hybrid ring has been disclosed herein for use as a mixer in either the microwave or millimeter wave range. As has been mentioned, whereas typical prior art rings have similar bandwidths for the LO and RF input ports, embodiments of the present invention are designed to exhibit different bandwidths at these ports. Thus, a typical embodiment of the invention might have an LO bandwidth of 5% or less and an RF bandwidth of 50% or more. The narrow bandwidth at the LO port is attributable to the end coupled filter 93 which narrow bands the LO port and also improves the isolation between the LO and RF ports. This allows the characteristic impedances of segments 56, 58, 60, and 62 and the even and odd mode impedances of coupled line sections 68 and 70 to be selected for a broad band impedance match. The circuit can then be used in a mixer with a fixed LO frequency and an RF frequency which is further away in frequency from the LO frequency than would be possible with a conventional hybrid ring.

Since the LO frequency should be centered in the frequency range over which the LO port has an optimized impedance match, the diodes 86, 88 can be matched over both the RF frequency range and the image signal frequency range so the mixer image signal termination can be controlled. The image signal can be either resistively terminated so it will not be reflected back into the mixer, or it can be reactively terminated with the proper phase so the image signal can be reflected back into the mixer and then converted to increase the IF signal output.

In addition to the foregoing, it is further pointed out that embodiments of the present invention will sum IF signal components better than typical prior art hybrid rings. More particularly, since the circuit is designed to operate with an RF frequency offset further from the LO frequency than in prior art hybrid rings, the IF frequency will be higher. Thus, the end coupled filter 93 will allow the IF signal components to be summed with much less perturbation than would be allowed by typical decoupling elements, such as gap 32 of FIG. 1. IF impedance matching is also enhanced, in accordance with the invention, as a consequence of the coupled line sections 68, 70 being closer to the diodes than the decoupling gaps are in FIG. 1. Thus, there will be less effect on IF impedance.

It should be understood that although a preferred hybrid ring embodiment has been disclosed herein, it is recognized that variations falling within the intended scope of the appended claims may readily occur to those skilled in the art. Thus, the diode arrangement depicted in FIG. 2 may be modified, as for example, by applying DC bias signals to diodes 86, 88, rather than connecting them directly to ground.

What is claimed is:

1. A hybrid ring suitable for use as a mixer to develop an intermediate frequency (IF) output signal in response to a radio frequency (RF) input signal and a local oscillator (LO) input signal, said hybrid ring comprising:
    a transmission line in the form of a ring having a length substantially equal to six quarter wavelengths at the frequency of said LO signal;
    diode means connected to said ring at first and second points spaced by substantially two quarter wavelengths;
    said ring comprising first and second quarter wavelength coupled line sections between said first and second points;
    each of said first and second coupled line sections including first and second spaced transmission line elements;
    said first and second coupled line section first elements having first ends respectively directly connected to said first and second points and having second ends unconnected; and
    said first and second coupled line section second elements having first ends unconnected and second ends directly interconnected to define an RF input signal port.

2. The hybrid ring of claim 1 including filter means coupled to a third point on said ring displaced by substantially one quarter wavelength from said first point, in a direction opposite from said second point, for defining an LO input signal port.

3. The hybrid ring of claim 2 wherein said filter means comprises an end coupled filter.

4. The hybrid ring of claim 2 including means coupled to a fourth point on said ring displaced by one quarter wavelength from said third point, in a direction opposite from said first point for defining an IF output signal port.

5. A hybrid junction comprising:
    a first transmission line essentially in the form of a ring having a length essentially equal to six multiples of a predetermined quarter wavelength and including a gap having a length considerably smaller than one quarter wavelength;
    a second transmission line essentially T shaped including first and second arms and a stem, said first and second arms each having a length essentially equal to one quarter wavelength;
    means orienting said second transmission line in close proximity to said first transmission line with said stem substantially aligned with said gap and with said first and second arms spaced from and extending substantially parallel to said ring on opposite sides of said gap; and
    filter means coupled to said ring at a point displaced from said gap by essentially two quarter wavelengths.

6. The junction of claim 5 wherein said filter means comprises an end coupled filter.

7. The junction of claim 6 including diode means connected to first and second points on said ring displaced in opposite directions by substantially one quarter wavelength from said gap.

8. The junction of claim 6 including a local oscillator (LO) input signal source and a radio frequency (RF) input signal source respectively coupled to said end coupled filter and said stem; and further including
    means coupled to a point on said ring displaced by substantially three quarter wavelengths from said gap for supplying an intermediate frequency (IF) output signal.

* * * * *